United States Patent [19]
Golla et al.

[11] Patent Number: 5,815,464
[45] Date of Patent: Sep. 29, 1998

[54] ADDRESS TRANSITION DETECTION CIRCUIT

[75] Inventors: Carla Maria Golla, Sesto San Giovanni; Matteo Zammattio, Milan; Stefano Zanardi, Seriate, all of Italy

[73] Assignee: SGS-Italy Microelectronics S.r.l., Agrate Brianza, Italy

[21] Appl. No.: 811,869

[22] Filed: Mar. 5, 1997

[30] Foreign Application Priority Data

Mar. 6, 1996 [EP] European Pat. Off. ............ 96830096

[51] Int. Cl.⁶ .................................................. G11C 7/00
[52] U.S. Cl. ..................... 365/233.5; 365/203; 365/233
[58] Field of Search ............................... 365/233.5, 203, 365/233

[56] References Cited

U.S. PATENT DOCUMENTS

| | | | |
|---|---|---|---|
| 5,264,737 | 11/1993 | Oikawa | 365/233.5 |
| 5,374,894 | 12/1994 | Fong | 365/233.5 |
| 5,493,538 | 2/1996 | Bergman | 365/233.5 |

Primary Examiner—Vu A. Le
Attorney, Agent, or Firm—Wolf, Greenfield & Sacks, P.C.

[57] ABSTRACT

An address transition detection circuit having a number of cells supplied with respective address signals and outputs connected in a wired NOR configuration to generate a pulse signal on detecting transitions of their respective address signals. The pulse signal is supplied to a source stage for generating an address transition signal having a first and second switching edge on receiving the pulse signal. The source stage has a monostable stage for generating an end-of-transition signal with a predetermined delay following reception of the pulse signal; and an output stage connected to the cells and to the monostable stage, which generates the first switching edge of the address transition signal on receiving the pulse signal, and the second switching edge on receiving the end-of-transition signal. The monostable stage presents a compensating structure for maintaining the delay in the switching of the end-of-transition signal despite variations in temperature and supply voltage.

33 Claims, 3 Drawing Sheets

ADDRESS TRANSITION DETECTION CIRCUIT

BACKGROUND OF THE INVENTION

1. Field of the Invention

The present invention relates to an address transition detection circuit.

2. Discussion of the Related Art

As is known, the first operation when addressing a flash memory is to detect when the level of the address signals has changed. This is done inside the memory itself by a so-called ATD (Address Transition Detection) circuit, which generates a signal (hereinafter referred to as ATDO) presenting a pulse of appropriate duration, which is used by the other devices in the read portion of the memory.

Figure 1:
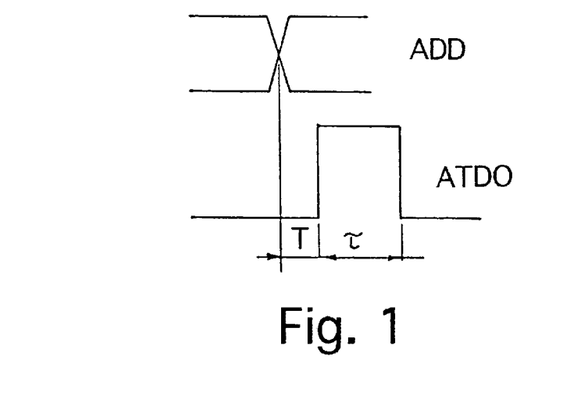
FIG. 1 shows the timing of the address transition signal.

FIG. 1 shows the switching sequence of an address ADD, and the corresponding generation of signal ATDO. As can be seen, the two parameters governing signal ATDO are the pulse duration $\tau$ and the delay T with which the pulse is generated after an address transition. At present, known ATD circuits are so designed as to provide for an extremely variable pulse duration $\tau$ (whereas delay T depends strictly on the speed with which the circuitry detects the address transition).

Basically, known ATD circuits comprise a number of cells (one for each address) connected in a wired NOR configuration to detect the switching of any one address signal and generate a corresponding pulse, and a chain of inverters to prolong the pulse duration; and each cell comprises a latch circuit in turn comprising two push-pull inverters.

Figure 2:
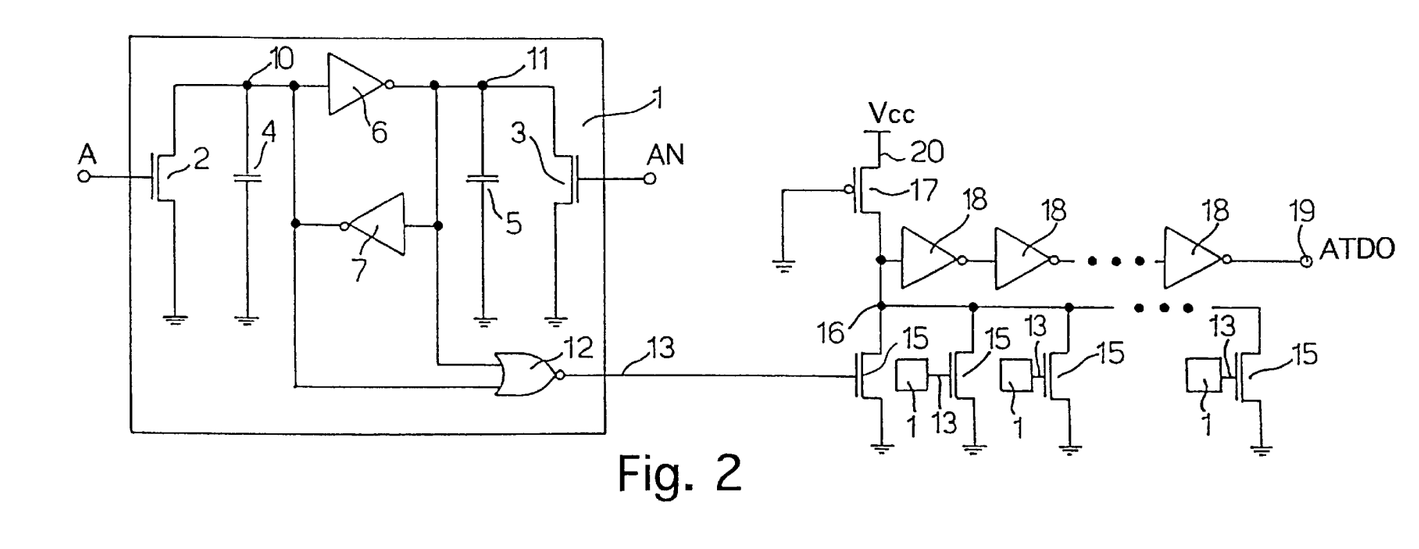
FIG. 2 shows the electric diagram of a known address transition detection circuit.

The above known ATD circuit is shown in FIG. 2 and will now be described by way of reference. FIG. 2 shows a number of identical cells 1, only one of which is shown in detail, and each cell 1 comprises a first and second, in this case NMOS, input transistor 2, 3, the gate terminals of which (defining respective inputs of cell 1) are supplied respectively with a direct address signal A and an inverted address signal AN. Input transistors 2, 3 are designed to present a high W/L (channel width to length) ratio, and have the source terminals grounded, and the drain terminals (defining respective nodes 10, 11) connected to one terminal of respective capacitors 4, 5 (the other terminals of which are grounded) and to the input of respective inverters 6, 7; the output of inverter 6 is connected to node 11; the output of inverter 7 is connected to node 10; and nodes 10 and 11 are also connected to the inputs of a NOR gate 12, the output of which defines the output 13 of cell 1.

The output 13 of each cell 1 is connected to the gate terminal of a respective NMOS detecting transistor 15, the source terminal of which is grounded, and the drain terminal of which is connected to a common node 16 to which detecting transistors 15 are all connected. Common node 16 is also connected to the drain terminal of a PMOS load transistor 17, the source terminal of which is connected to the supply line 20 (at $V_{cc}$), and the gate terminal of which is grounded (and therefore always on). Common node 16 is also connected to a number of cascade connected inverters 18, the last of which defines the circuit output 19 feeding signal ATDO.

The state of each cell 1 is determined by address signals A and AN, which control charging and discharging of capacitors 4, 5. More specifically, in standby mode, only one of the address signals, e.g. AN, is high, while the other (in this case, A) is low, so that capacitor 5 is discharged and kept grounded by respective input transistor 3, and capacitor 4 is charged by virtue of transistor 2 being off. The output of NOR gate 12, which receives at the inputs a low and a high signal, is therefore low, and respective detecting transistor 15 is off. In the absence of address transitions, transistors 15 are all off, and transistor 17 keeps node 16 high, so that output signal ATDO presents a predetermined, e.g. low, logic state.

Upon transition of an address signal, signals A and AN of the relative cell 1 switch. In the example shown, this means signal AN switches to low and A to high, so that transistor 2 is turned on and rapidly discharges capacitor 4; and transistor 3 is turned off so that capacitor 5 is charged via the pull-up transistor of inverter 6 (sized to present a low W/L ratio and therefore to be flowed by little current). Capacitor 5 is therefore charged slowly, so that, when capacitor 4 is discharged and until capacitor 5 is charged, NOR gate 12 presents two low input signals and switches to supply output 13 with a high signal, which turns on the respective detecting transistor 15, lowers common node 16, and switches ATDO. Upon capacitor 5 reaching the threshold voltage of NOR gate 12, this switches to switch its output 13 back to low; respective detecting transistor 15 is turned off; common node 16 switches back to high; and signal ATDO switches back to low to terminate the pulse.

In the FIG. 2 circuit, the chain of inverters 18 provides for prolonging the duration of the ATDO signal pulse, which duration is highly sensitive to variations in temperature and in supply voltage $V_{cc}$. In fact, in the known circuit featuring simple chains of inverters, slight variations in threshold voltage may result in marked variations in the current supplied by the inverters, especially when the supply voltage is low (from 2 to 3.8 V).

This variability is a disadvantage in memories in which correct operation of the read circuits requires a precise predetermined pulse duration which is substantially stable in relation to both temperature and supply.

SUMMARY OF THE INVENTION

It is an object of the present invention to provide an ATD circuit designed to overcome the drawbacks of known circuits, and which in particular generates an address transition signal of predetermined, stable duration.

One embodiment of the present invention is directed to an address transition detection circuit. The address transition detection circuit includes a plurality of cells each having an input to receive a respective address signal and an output to provide a first pulse signal. Each of the plurality of cells is constructed and arranged to detect transitions of its respective address signal and to generate the first pulse signal upon the detection of a transition of its respective address signal. The address transition detection circuit also includes a source stage having an input coupled to the output of each of the plurality of cells to receive the first pulse signal. The source stage is constructed and arranged to generate an address transition signal having first and second switching edges upon receipt of the first pulse signal. The source stage includes a monostable stage and an input coupled to the output of each of the plurality of cells. The monostable stage is constructed and arranged to generate the second switching edge of the address transition signal a predetermined time period after generation of the first switching edge of the address transition signal.

Another embodiment of the present invention is directed to an address transition detection circuit for coupling to a plurality of address circuits. Each of the plurality of address circuits has an input to receive a respective address and an output that provides a first pulse signal upon receipt of its respective address at its input. The address transition detection circuit includes an input to couple to the outputs of the plurality of address circuits to receive the first pulse signal from the plurality of address circuits, a detection circuit having a first input coupled to the input of the address detection circuit to detect the first pulse signal from the plurality of address circuits, an output that provides, in response to the detection of the first pulse signal, a second pulse signal having a pulse duration, and a second input that receives a third pulse signal. The detection circuit is constructed and arranged such that the characteristics of the third pulse signal determine the pulse duration of the second pulse signal. The address transition detection circuit also includes a timing circuit having a first input coupled to the detection circuit to receive a signal indicating receipt of the first pulse signal by the detection circuit and having an output coupled to the second input of the detection circuit to provide the third pulse signal a predetermined time period after the detection of the first pulse signal.

Another embodiment of the present invention is directed to an address transition detection circuit for coupling to a plurality of address circuits. Each of the plurality of address circuits has an input to receive a respective address and an output that provides a first pulse signal upon receipt of its respective address at its input. The address transition detection circuit includes a first input coupled to the output of the plurality of address circuits to receive the first pulse signal from the plurality of address circuits, second and third inputs to couple respectively to first and second reference potential lines to receive a reference voltage, and a detection circuit having a first input coupled to the input of the address detection circuit to detect the first pulse signal from the plurality of address circuits, an output that provides, in response to the detection of the first pulse signal, a second pulse signal having a pulse duration, and a second input that receives a third pulse signal. The detection circuit is constructed and arranged such that characteristics of the third pulse signal determine the pulse duration of the second pulse signal. The address transition detection circuit also includes means for generating the third pulse signal at a predetermined time after the detection of the first pulse signal, the third pulse signal having characteristics that are substantially independent of variations in the reference voltage and variations in operating temperature of the address transition detection circuit.

Another embodiment of the present invention is directed to a method for generating an address detection pulse signal in a memory circuit having first and second inputs to couple to first and second voltage reference lines to receive a reference voltage. The address detection pulse signal has a first transition edge and a second transition edge such that a time period between the first and second transition edges defines a pulse duration of the address detection pulse signal. The method includes steps of detecting an address signal, generating a first pulse signal in response to the detection of the address signal, detecting the first pulse signal, generating the first transition edge of the address detection pulse signal, and at the predetermined period of time, generating the second transition edge of the detection pulse signal. The predetermined period of time is substantially independent of variations in the reference voltage and variations in operating temperature of the memory.

Another embodiment to the present invention is directed to a memory that includes a plurality of address circuits, each of the plurality of address circuits having an input to receive a respective address and an output that provides a first pulse signal upon receipt of its respective address at its input, and a detection circuit having a first input coupled to the plurality of address circuits to detect the first pulse signal from the plurality of address circuits, an output that provides, in response to the detection of the first pulse signal, a second pulse signal having a pulse duration, and a second input that receives a third pulse signal. The detection circuit is constructed and arranged such that characteristics of the third pulse signal determine the pulse duration of the second pulse signal. The memory further includes a timing circuit having a first input coupled to the detection circuit to receive a signal indicating receipt of the first pulse signal by the detection circuit and having an output coupled to the second input of the detection circuit to provide a third pulse signal at a predetermined time after the detection of the first pulse signal.

DETAILED DESCRIPTION

Figure 3:
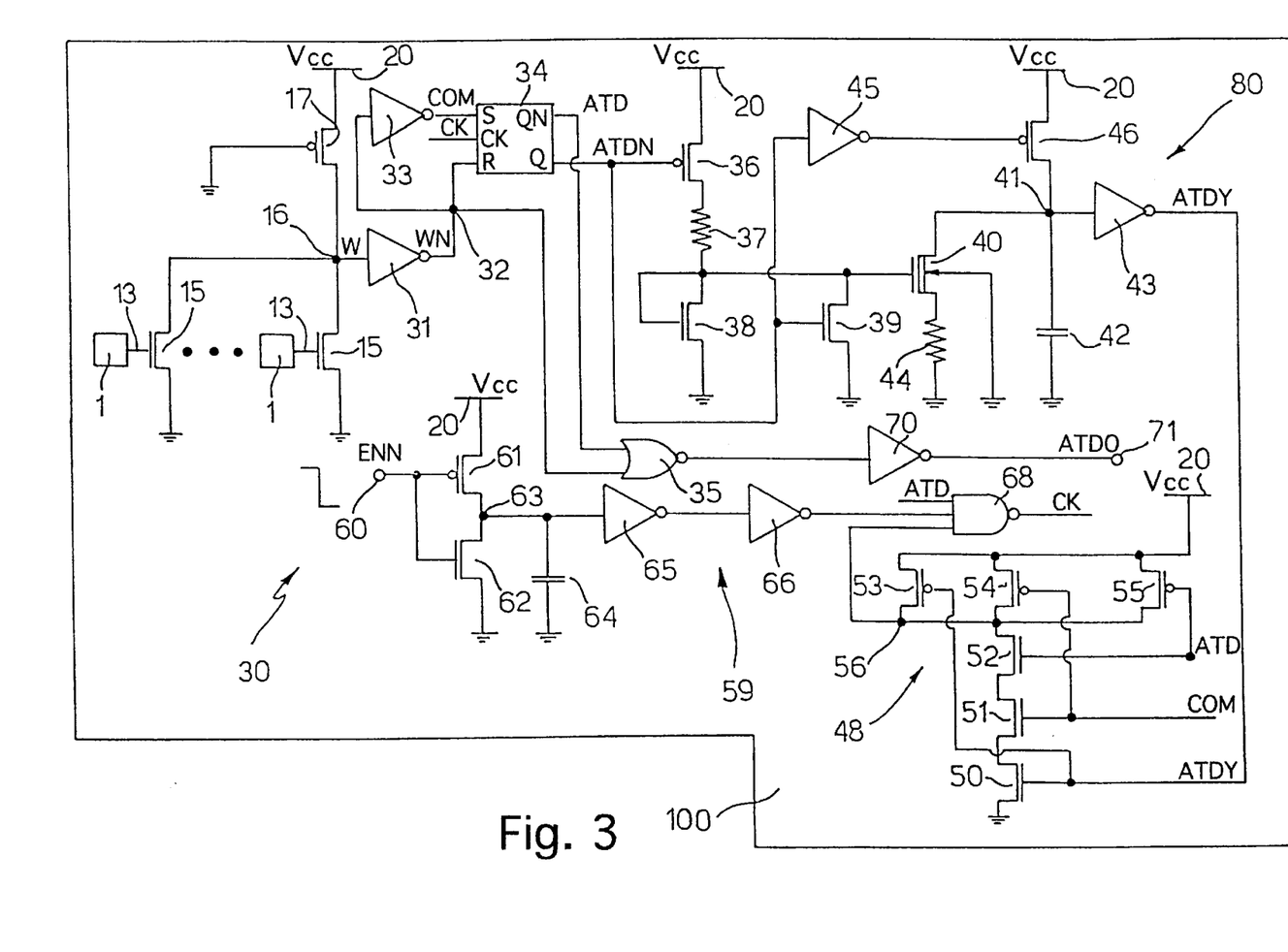
FIG. 3 shows an electric diagram of the address transition detection circuit according to the invention.

Reference number 30 in FIG. 3 designates an address transition detection circuit, which is inserted in a nonvolatile, e.g. flash, memory 100, and comprises a number of cells 1 identical to the known cells in FIG. 2. In known manner, cells 1 (one for each address signal) present an output 13 connected to a respective detecting transistor 15, and detecting transistors 15 are connected in a wired NOR configuration to common node 16 in turn connected to supply line 20 via load transistor 17.

In FIG. 3, common node 16 (presenting a signal W) is connected to the input of an inverter 31, the output of which defines a node 32 presenting a signal WN; node 16 is also connected to the input of an inverter 33, to the reset input of an SR flip-flop 34, and to one input of a two-input NOR gate 35; the output of inverter 33 (presenting a signal COM) is connected to the set input of flip-flop 34; the direct output Q of flip-flop 34 (presenting a signal ATDN) is connected to a monostable stage 80; and the inverted output QN of flip-flop 34 (presenting a signal ATD) is connected to the second input of NOR gate 35.

Monostable stage 80 comprises a PMOS input transistor 36 with its gate terminal connected to output Q of flip-flop 34, its source terminal connected to supply line 20, and its drain terminal connected to one terminal of a resistor 37, the other terminal of which is connected to the anode of a diode 38. Diode 38 is in the form of an NMOS transistor with shorted gate and drain terminals and a grounded cathode; the anode of diode 38 is connected to the drain terminal of an NMOS transistor 39, and to the gate terminal of a native NMOS transistor 40 (i.e. presenting an unmodified, i.e. low, threshold). Transistor 39 has the gate terminal connected to output Q of flip-flop 34, and the source terminal grounded; and native transistor 40 has a gate terminal defining a node 41, the source terminal grounded via a resistor 44, and a grounded bulk. Resistor 44 must present a low thermal coefficient (below $2\times10^{-3}$), is preferably formed by an $N^+$ diffusion in the substrate of the integrated device, and has, for example, a resistance of 12 KΩ.

Output Q of flip-flop 34 is also connected to the input of an inverter 45, the output of which is connected to the gate terminal of a PMOS load transistor 46, the source terminal of which is connected to supply line 20, and the drain terminal of which is connected to node 41. Node 41 is grounded via a capacitor 42 (e.g. of 600 fF) and is connected to the input of an inverter 43, the output of which is connected to one input of a three-input NAND gate 48 to which it supplies signal ATDY.

NAND gate 48 comprises three NMOS transistors 50, 51, 52 connected in series, and three PMOS transistors 53, 54, 55 connected in parallel. More specifically, PMOS transistors 53, 54, 55 have the source terminals connected to one another and to supply line 20; the drain terminals connected to one another and defining a node 56; and the gate terminals connected respectively to the output of inverter 43, to the output of inverter 33, and to output QN of flip-flop 34, so as to respectively receive signals ATDY, COM and ATD. Transistors 50, 51, 52 are connected between ground and node 56, and have the gate terminals connected respectively to the gate terminals of transistors 53, 54, 55.

Circuit 30 includes an initialization branch 59 presenting an enable input 60 supplied with an inverted enable signal ENN. Input 60 is connected to the gate terminals of a PMOS transistor 61 and an NMOS transistor 62 connected in series between supply line 20 and ground. The intermediate node 63 between (and connected to the drain terminals of) transistors 61 and 62 is connected to one terminal of a capacitor 64 (the other terminal of which is grounded) and to the input of an inverter 65. The output of inverter 65 is connected to the input of a further inverter 66, the output of which is connected to one input of a three-input NAND gate 68, a second input of which is connected to node 56, and a third input of which is connected to output QN of flip-flop 34 and therefore receives signal ATD. The output of NAND gate 68 is connected to a clock input CK of flip-flop 34, to which it supplies clock signal CK.

Finally, the output of NOR gate 35 is connected to the input of an inverter 70, the output 71 of which defines the output of circuit 30 and presents address transition signal ATDO.

Figure 4:
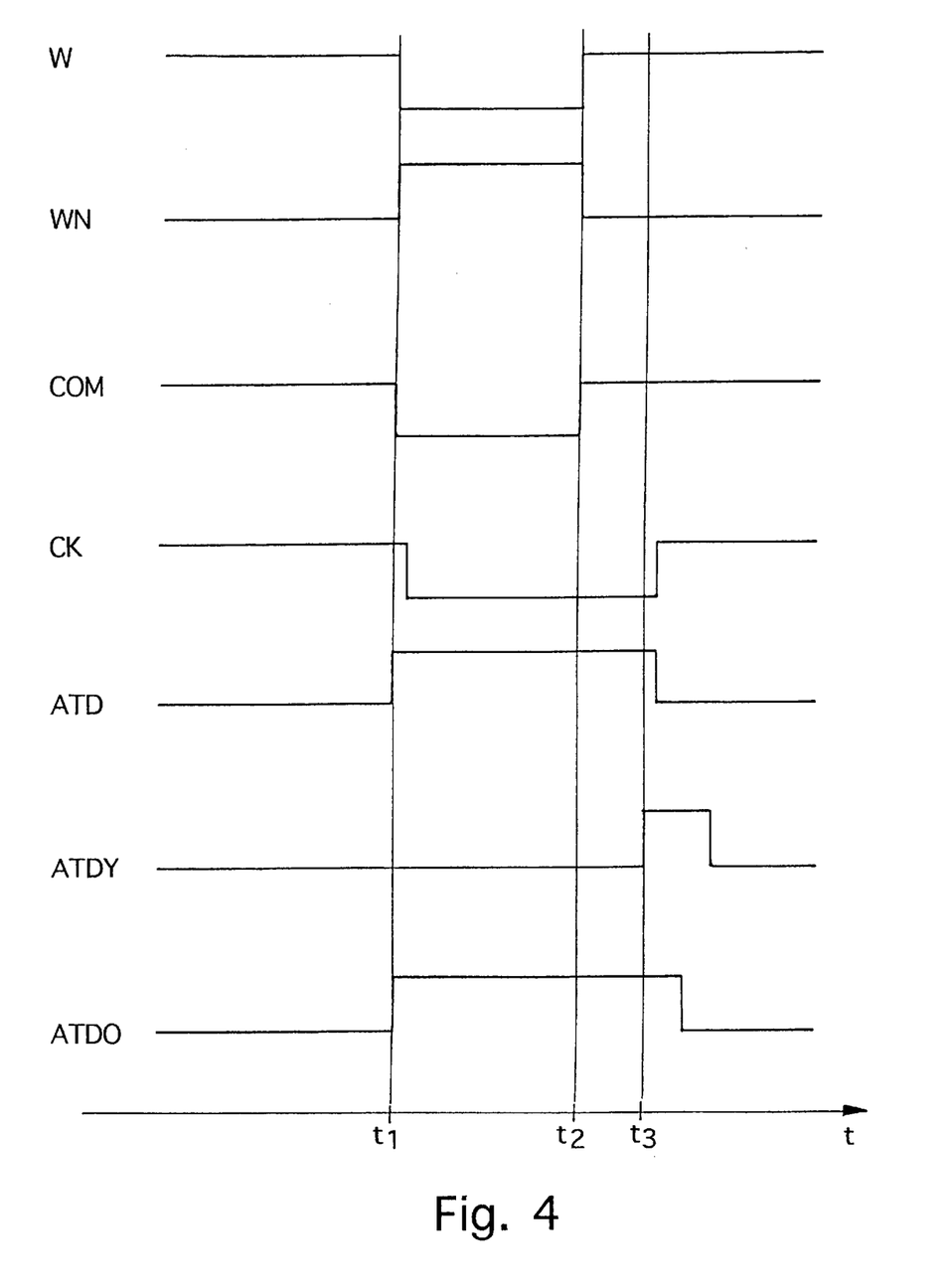
FIG. 4 shows a time plot of a number of signals in the FIG. 3 circuit.

Operation of the FIG. 3 circuit will now be described with reference also to FIG. 4.

In the absence of address transitions, and with the circuit in the steady standby condition (signal ENN low), detecting transistors 15 are off, node 16 is high, signal WN is low and COM high. Moreover, as explained in more detail later on, signal CK is high, flip-flop 34 is set (so that signal ATDN is high and ATD low), and signal ATDO is low. Consequently, transistor 36 is off, the output of inverter 45 is low, and transistor 46 is on and connects node 41 to the supply. At the same time, transistor 39 is on and grounds the gate terminal of native transistor 40, which is therefore off, so that node 41 is high, signal ATDY is low, and capacitor 42 is charged to $V_{cc}$.

As soon as a cell 1 detects a transition of its own address (instant $t_1$ in FIG. 4), respective transistor 15 is turned on, thus switching signal W to low; signal WN switches to high; signal COM switches to low; flip-flop 34 switches; signal ATD switches to high; signal ATDN switches to low; and output signal ATDO switches to high. High switching of ATD switches NAND gate 68 (whose other two inputs are high) and signal CK to low, thus disabling any further switching of flip-flop 34.

Moreover, the switching of ATDN turns on transistor 36 and the branch comprising components 37–38, turns off transistors 39 and 46, and turns on native transistor 40, the gate terminal of which presents a voltage versus ground equal to the voltage drop across diode 38—in turn equal to the threshold voltage of a standard, non-native transistor—and therefore substantially constant. Consequently, capacitor 42 is grounded via transistor 40 and resistor 44, and discharges a constant current, by virtue of transistor 40 being so sized (i.e. presenting such a W/L ratio) as to determine the current in the branch. Within the branch, resistor 44 provides for reducing the voltage drop $V_{GS}$ between the gate and source terminals of native transistor 40 as a function of the amount of conducting current of transistor 40.

The voltage at node 41 therefore falls gradually until, after a period of time τ depending on the current flow in capacitor 42, it reaches the trigger threshold of inverter 43, the output signal ATDY of which switches to high (instant $t_3$). In the meantime, since the circuit is so designed that inverter 43 always switches after the end of the address transition, signals W, WN and COM have once more switched back to the standby state (instant $t_2$ in FIG. 4). Since flip-flop 34 is prevented from switching, however, such switchings do not affect the rest of the circuit, so that signal CK remains low, and the output of NAND gate 48 is kept high by signal ATDY at its input.

Conversely, when ATDY switches, NAND gate 48 is supplied with three high logic levels, which turn on all three transistors 50–52, and turn off transistors 53–55, so that the output of NAND gate 48 switches to low; signal CK switches to high, thus enabling flip-flop 34, which switches back to standby with a low ATD and a high ATDN signal; gates 35 and 70 also switch to terminate the pulse of signal ATDO, which switches to low; monostable stage 80 is restored to the initial condition, by virtue of capacitor 42 being discharged rapidly when native transistor 40 is turned off and transistor 46 is turned on; and signal ATDY switches to low after a brief high pulse which resets the whole of circuit 30.

Initialization branch 59, which is turned on together with memory 100, provides for setting circuit 30, when this is turned on, to a definite operative condition using the overall inverted enabling signal ENN of memory 100. In the absence of branch 59, in fact, flip-flop 34, when circuit 30 is turned on, could be set to a metastable condition in which output signals ATD and ATDN fail to present a definite logic state and are stopped halfway ($V_{cc}/2$). In which case, NOR 35 would be supplied with a low signal (WN) and an intermediate signal (ATD), and may switch its output to low, so that output signal ATDO may not switch to 0. What is more, monostable stage 80 would also be in a metastable operating condition in which transistor 36 is partly conductive, transistor 39 is on, transistor 40 is off, inverter 45 is at an intermediate operative level, and transistor 46 is turned on slightly but enough to bring node 41 to a voltage of over $V_{cc}/2$. As a result, signal ATDY would be low, the output of NAND gate 48 would be high, NAND gate 68 would receive a high signal and signal (ATD) at an intermediate level (in which case, there would be no third input of gate 68), and signal CK would be uncertain, probably low, and incapable of definitely setting flip-flop 34.

Initialization branch 59, on the other hand, prevents this from happening. That is, when memory 100 is turned on, the initially high ENN signal switches to low, so that transistor 61, which forms an inverter with transistor 62 and is initially off (node 63 low), is turned on and begins charging capacitor 64 which was previously discharged. While capacitor 64 is being charged, the output of inverter 66 remains low to ensure signal CK is high, even if signal ATD is in a metastable condition as described above; and the presence of a "1" at input CK of flip-flop 34, together with a "0" at input R and a "1" at input S, ensures the flip-flop is set to the desired standby condition with output Q (signal ATDN) high and output QN (signal ATD) low.

When capacitor 64 is charged to the trigger threshold of inverter 65, the output of inverter 66 switches to high, but the output of NAND gate 68 (and signal CK) does not switch, since ATD is now definitely low; and circuit 30 is now in the standby condition, ready to detect address transitions.

The advantages of the circuit described are as follows. In particular, it provides for achieving ATDO pulses of a duration insensitive to variations in temperature (particularly between −40° C. and 125° C.) by virtue of diffused resistor 44. In fact, for a given $V_{GS}$ (gate-source voltage drop) of native transistor 40, a fall in temperature increases current flow through native transistor 40 and hence through resistor 44; and resistor 44 (which presents a resistance with a low thermal coefficient) presents a voltage drop proportional to the current flowing through it, and therefore reduces the voltage drop $V_{GS}$ across native transistor 40 by limiting current flow through it. In other words, resistor 44 performs a negative feedback function to limit the increasing discharge current of capacitor 42 (and vice versa) alongside variations in temperature.

The discharge current of capacitor 42 is also substantially independent of variations in supply voltage $V_{cc}$, by being imposed by the voltage drop across diode 38 (equal to the threshold voltage of the transistor forming it) and by the voltage drop $V_{GS}$ of native transistor 40.

Simulation tests by the Applicant have shown the circuit according to the invention is capable of maintaining very small temperature-induced variations in the duration τ of the ATDO signal pulse (less than 10% of the ambient temperature value at −40° C., and less than 20% of the ambient temperature value at +125° C.), and is practically insensitive to variations in supply voltage between 2 and 3.8 V.

Moreover, circuit 30 does not require precise external voltage references, and consumes no current in the absence of address transitions.

Clearly, changes may be made to the circuit as described and illustrated herein without, however, departing from the scope of the present invention. For example, resistor 44 may be formed differently (i.e. need not necessarily be diffused), providing a low thermal coefficient is assured.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. An address transition detection circuit comprising:
   a plurality of cells each having an input to receive a respective address signal and an output that provides a first pulse signal, each of the plurality of cells being constructed and arranged to detect transitions of its respective address signal and to generate the first pulse signal upon the detection of a transition of its respective address signal; and
   a source stage having an input coupled to the output of each of the plurality of cells to receive the first pulse signal, the source stage being constructed and arranged to generate an address transition signal having first and second switching edges upon receipt of the first pulse signal, wherein the source stage includes a monostable stage having an input coupled to the output of each of the plurality of cells, the monostable stage being constructed and arranged to generate said second switching edge of said address transition signal a predetermined time period after generation of said first switching edge of said address transition signal, wherein the source stage includes a synchronous memory element having a clock enable input.

2. The address transition detection circuit of claim 1, wherein said source stage further includes a first logic circuit, coupled to the output of each of the plurality of cells, that generates a second pulse signal upon receipt of the first pulse signal from one of said plurality of cells.

3. An address transition detection circuit comprising:
   a plurality of cells each having an input to receive a respective address signal and an output that provides a first pulse signal, each of the plurality of cells being constructed and arranged to detect transitions of its respective address signal and to generate the first pulse signal upon the detection of a transition of its respective address signal; and
   a source stage having an input coupled to the output of each of the plurality of cells to receive the first pulse signal, the source stage being constructed and arranged to generate an address transition signal having first and second switching edges upon receipt of the first pulse signal, wherein the source stage includes a monostable stage having an input coupled to the output of each of the plurality of cells, the monostable stage being constructed and arranged to generate said second switching edge of said address transition signal a predetermined time period after generation of said first switching edge of said address transition signal, wherein such source stage further includes a first logic circuit, coupled to the output of each of the plurality of sells, that generates a second pulse signal upon receipt of the first pulse signal from one of said plurality of cells, wherein said monostable stage includes a capacitive element, a first switch, a current source, a resistive element, and an enable circuit, wherein the capacitive element is coupled to a first reference potential line through the first switch and to a second reference potential line through the current source and the resistive element, and wherein the enable circuit is connected to the current source.

4. The address transition detection circuit of claim 3, wherein said current source includes a first transistor having first and second terminals coupled respectively to said capacitive element and said resistive element, and a control terminal coupled to said enable circuit.

5. The address transition detection circuit of claim 4, wherein said first transistor includes a native MOS transistor, and wherein said enable circuit includes a diode element coupled between said control terminal of said first transistor and said second reference potential line.

6. The address transition detection circuit of claim 5, wherein:
   said diode element is coupled to said first reference potential line through a second switch;
   each of said first switch and said second switch has a control terminal to respectively receive first and second control signals; and
   said address transition detection circuit further comprises a second logic circuit, coupled to said first logic circuit to receive said second pulse signal, that generates said first and second control signals upon receipt of said second pulse signal, said first and second control signals being in phase opposition with each other.

7. The address transition detection circuit of claim 6, wherein each of said first and second switches includes a MOS transistor.

8. The address transition detection circuit of claim 7, wherein said resistive element includes a diffused resistor.

9. The address transition detection circuit of claim 8, wherein said source stage includes a memory element having a first input coupled to said first logic circuit, a second input coupled to a disable stage, and an output coupled to said monostable stage and to an output of said source stage.

10. The address transition detection circuit of claim 9, wherein said monostable stage has an output that provides an end-of-transition signal having a pulse after said predetermined time delay, and wherein said disable stage includes a third logic circuit having first, second and third inputs coupled respectively to said output of said monostable stage, to the output of said first logic circuit, and to the output of said memory element, and an output coupled to said enable input of said memory element, said output of said third logic circuit providing a turn-on signal having one of a first and a second level, said third logic circuit generating said first level to disable said memory element upon receiving said first edge of said second pulse signal, and said second level to enable said memory element on receiving said end-of-transition signal.

11. The address transition detection circuit of claim 10, further comprising:

an initialization stage having an input to receive an enable signal and an output; and a delay circuit that generates a delayed enable signal;

wherein said disable stage further includes a fourth logic circuit having first and second inputs and an output, said first and second inputs of said fourth logic circuit being respectively coupled to the output of said initialization stage and to the output of said third logic circuit, and said output of said fourth logic circuit being coupled to said second input of said memory element.

12. The address transition detection circuit of claim 11, further comprising an output stage interposed between said output of said memory element and said output of said source stage, said output stage including a fifth logic circuit, coupled to said output of said memory element and to the output of said first logic circuit, that generates said first switching edge of said address transition signal upon receiving said second pulse signal and said second switching edge of said output signal upon said memory element switching.

13. The address transition detection circuit of claim 3, wherein said resistive element includes a diffused resistor.

14. An address transition detection circuit comprising:

a plurality of cells each having an input to receive a respective address signal and an output that provides a first pulse signal, each of the plurality of cells being constructed and arranged to detect transitions of its respective address signal and to generate the first pulse signal upon the detection of a transition of its respective address signal: and a source stage having an input coupled to the output of each of the plurality of cells to receive the first pulse signal, the source stage being constructed and arranged to generate an address transition signal having first and second switching edges upon receipt of the first pulse signal, wherein the source stage includes a monostable stage having an input coupled to the output of each of the plurality of cells, the monostable stage being constructed and arranged to generate said second switching edge of said address transition signal a predetermined time period after generation of said first switching edge of said address transition signal, wherein said source stage further includes a first logic circuit logic circuit, coupled to the output of each of the plurality of sells, that generates a second pulse signal upon receipt of the first pulse signal from one of said plurality of cells, wherein said source stage includes a memory element having a first input coupled to said first logic circuit, a second input coupled to a disable stage, and an output coupled to said monostable stage and to an output of said source stage.

15. The address transition detection circuit of claim 9, further comprising an output stage interposed between said output of said memory element and said output of said source stage, said output stage including a fifth logic circuit, coupled to said output of said memory element and to the output of said first logic circuit, that generates said first switching edge of said address transition signal upon receiving said second pulse signal and said second switching edge of said output signal upon said memory element switching.

16. An address transition detection circuit for coupling to a plurality of address circuits, each of the plurality of address circuits having an input to receive a respective address and an output that provides a first pulse signal upon receipt of its respective address at its input, the address transition detection circuit comprising:

an input to couple to the outputs of the plurality of address circuits to receive the first pulse signal from the plurality of address circuits;

a detection circuit having a first input coupled to the input of the address detection circuit to detect the first pulse signal from the plurality of address circuits, an output that provides, in response to the detection of the first pulse signal, a second pulse signal having a pulse duration, and a second input that receives a third pulse signal, the detection circuit being constructed and arranged such that characteristics of the third pulse signal determine the pulse duration of the second pulse signal; and a timing circuit having a first input coupled to the detection circuit to receive a signal indicating receipt of the first pulse signal by the detection circuit and having an output coupled to the second input of the detection circuit to provide the third pulse signal at a predetermined time period after the detection of the first pulse signal.

17. The address transition detection circuit of claim 16, wherein the timing circuit has second and third inputs to couple respectively to first and second reference potential lines to receive a reference voltage, and wherein the timing circuit includes a monostable circuit that generates an output signal having characteristics that are substantially independent of variations in the reference voltage and variations in operating temperature of the address transition detection circuit.

18. The address transition detection circuit of claim 17, wherein the monostable circuit includes a capacitive element, a first switch, a current source, a resistive element, and an enable circuit, wherein the capacitive element is coupled to the second input of the monostable circuit through the first switch and to the third input of the monostable circuit through the current source and the resistive element, and wherein the enable circuit is coupled to the current source.

19. The address transition detection circuit of claim 18, wherein the timing circuit includes a disable circuit that receives the output signal of the monostable circuit and provides the third pulse signal.

20. The address transition detection circuit of claim 19, further comprising an initialization circuit coupled to the detection circuit to initialize the detection circuit when power is applied to the address transition detection circuit.

21. The address transition detection circuit of claim 17, wherein the timing circuit includes a disable circuit that receives the output signal of the monostable circuit and provides the third pulse signal.

22. The address transition detection circuit of claim 16, further comprising an initialization circuit coupled to the detection circuit to initialize the detection circuit when power is applied to the address transition detection circuit.

23. An address transition detection circuit for coupling to a plurality of address circuits, each of the plurality of address circuits having an input to receive a respective address and an output that provides a first pulse signal upon receipt of its respective address at its input, the address transition detection circuit comprising:

a first input to couple to the outputs of the plurality of address circuits to receive the first pulse signal from the plurality of address circuits;

second and third inputs to couple respectively to first and second reference potential lines to receive a reference voltage;

a detection circuit having a first input coupled to the input of the address detection circuit to detect the first pulse signal from the plurality of address circuits, an output that provides, in response to the detection of the first pulse signal, a second pulse signal having a pulse duration, and a second input that receives a third pulse signal, the detection circuit being constructed and arranged such that characteristics of the third pulse signal determine the pulse duration of the second pulse signal; and means for generating the third pulse signal at a predetermined time after the detection of the first pulse signal, the third pulse signal having characteristics that are substantially independent of variations in the reference voltage and variations in operating temperature of the address transition detection circuit.

24. The address transition detection circuit of claim 23, further comprising means for initializing the detection circuit when power is applied to the address transition detection circuit.

25. A method for generating an address detection pulse signal in a memory circuit having first and second inputs to couple to first and second voltage reference lines to receive a reference voltage, the address detection pulse signal having a first transition edge and a second transition edge such that a time period between the first and second transition edges defines a pulse duration of the address detection pulse signal, the method including steps of:

detecting an address signal;

generating a first pulse signal in response to the detection of the address signal;

detecting the first pulse signal;

generating the first transition edge of the address detection pulse signal; and after a predetermined period of time, generating the second transition edge of the detection pulse signal;

wherein the predetermined period of time is substantially independent of variations in the reference voltage and variations in operating temperature of the memory.

26. The method of claim 25, further comprising a steps of:

providing power to the memory;

providing an initialization signal to the memory to set signals within the memory to an initialized state.

27. A memory comprising:

a plurality of address circuits, each of the plurality of address circuits having an input to receive a respective address and an output that provides a first pulse signal upon receipt of its respective address at its input;

a detection circuit having a first input coupled to the plurality of address circuits to detect the first pulse signal from the plurality of address circuits, an output that provides, in response to the detection of the first pulse signal, a second pulse signal having a pulse duration, and a second input that receives a third pulse signal, the detection circuit being constructed and arranged such that characteristics of the third pulse signal determine the pulse duration of the second pulse signal; and a timing circuit having a first input coupled to the detection circuit to receive a signal indicating receipt of the first pulse signal by the detection circuit and having an output coupled to the second input of the detection circuit to provide the third pulse signal at a predetermined time after the detection of the first pulse signal.

28. The memory of claim 27, wherein the timing circuit has second and third inputs to couple respectively to first and second reference potential lines to receive a reference voltage, and wherein the timing circuit includes a monostable circuit that generates an output signal having characteristics that are substantially independent of variations in the reference voltage and variations in operating temperature of the memory.

29. The memory of claim 28, wherein the monostable circuit includes a capacitive element, a first switch, a current source, a resistive element, and an enable circuit, wherein the capacitive element is coupled to the second input of the monostable circuit through the first switch and to the third input of the monostable circuit through the current source and the resistive element, and wherein the enable circuit is coupled to the current source.

30. The memory of claim 29, wherein the timing circuit includes a disable circuit that receives the output signal of the monostable circuit and provides the third pulse signal.

31. The memory of claim 30, further comprising an initialization circuit coupled to the detection circuit to initialize the detection circuit when power is applied to the memory.

32. The memory of claim 28, wherein the timing circuit includes a disable circuit that receives the output signal of the mono stable circuit and provides the third pulse signal.

33. The memory of claim 27, further comprising an initialization circuit coupled to the detection circuit to initialize the detection circuit when power is applied to the memory.

* * * * *

UNITED STATES PATENT AND TRADEMARK OFFICE
CERTIFICATE OF CORRECTION

PATENT NO. : 5,815,464

DATED : September 29, 1998

INVENTOR(S): Carla Maria Golla, Matteo Zammattio and Stefano Zanardi

It is certified that error appears in the above-identified patent and that said Letters Patent is hereby corrected as shown below:

On the title page, item [73] should read:

[73] Assignee: SGS-Thomson Microelectronics S.r.l., Agrate Brianza, Italy

Signed and Sealed this

Thirtieth Day of March, 1999

Attest:

Q. TODD DICKINSON

*Attesting Officer*     Acting Commissioner of Patents and Trademarks